(12) United States Patent
Yoon et al.

(10) Patent No.: US 7,964,938 B2
(45) Date of Patent: Jun. 21, 2011

(54) SEMICONDUCTOR PACKAGES HAVING ELECTROMAGNETIC INTERFERENCE-SHIELDING FUNCTION, MANUFACTURING METHOD THEREOF AND JIG

(76) Inventors: Jum-chae Yoon, Seoul (KR); Eun-soo Hyun, Paju-si (KR); Seung-ki Kim, Goyang-si (KR)

(*) Notice: Subject to any disclaimer, the term of this patent is extended or adjusted under 35 U.S.C. 154(b) by 147 days.

(21) Appl. No.: 12/474,375

(22) Filed: May 29, 2009

(65) Prior Publication Data

US 2009/0294930 A1    Dec. 3, 2009

(30) Foreign Application Priority Data

May 30, 2008   (KR) .................. 10-2008-0050975

(51) Int. Cl.
*H01L 23/556* (2006.01)
(52) U.S. Cl. ......... 257/660; 257/E23.114; 257/E21.076; 438/121
(58) Field of Classification Search .................. 361/763, 361/816; 257/678, 660, E23.114, E21.076; 438/121
See application file for complete search history.

(56) References Cited

U.S. PATENT DOCUMENTS

| | | | | |
|---|---|---|---|---|
| 6,707,682 B2* | 3/2004 | Akiba et al. | .................. | 361/763 |
| 2009/0086461 A1* | 4/2009 | Lee | .................. | 361/816 |
| 2009/0212401 A1* | 8/2009 | Do et al. | .................. | 257/659 |
| 2009/0294928 A1* | 12/2009 | Kim et al. | .................. | 257/659 |
| 2009/0294931 A1* | 12/2009 | Sham et al. | .................. | 257/660 |
| 2009/0302439 A1* | 12/2009 | Pagaila et al. | .................. | 257/660 |
| 2010/0244024 A1* | 9/2010 | Do et al. | .................. | 257/48 |

* cited by examiner

*Primary Examiner* — W. David Coleman
(74) *Attorney, Agent, or Firm* — Lexyoume IP Group, PLLC

(57) ABSTRACT

The present invention relates to relates to a semiconductor package having a function of shielding electromagnetic interference (EMI), a manufacturing method thereof and a jig, and more particularly, to such a semiconductor package having an electromagnetic interference (EMI)-shielding function, a manufacturing method thereof and a jig for use in a plasma sputtering, in which a nickel alloy is coated on the surface of a semiconductor package by a sputtering method so as to shield electromagnetic interference (EMI) generated from the semiconductor package.

9 Claims, 7 Drawing Sheets

[FIG 1]
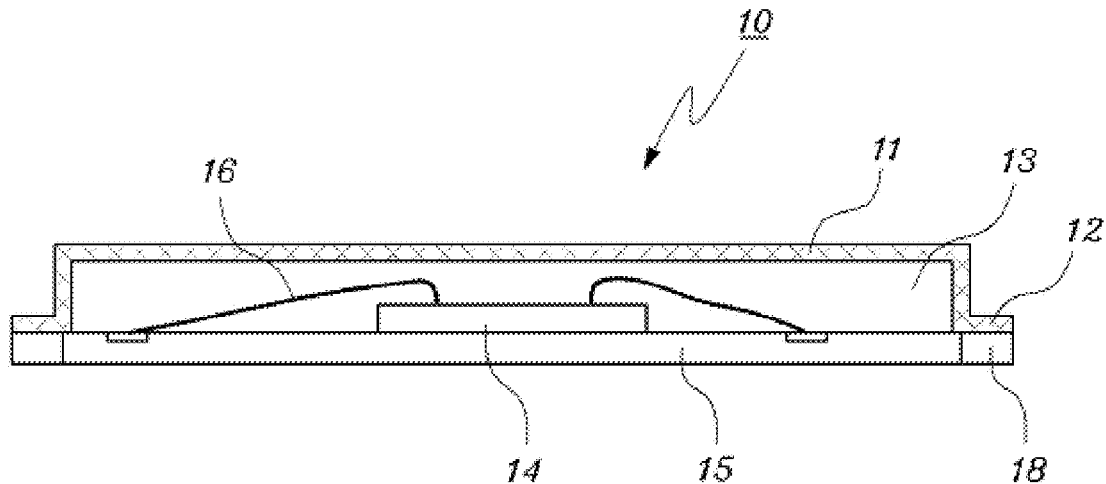
[FIG 2]
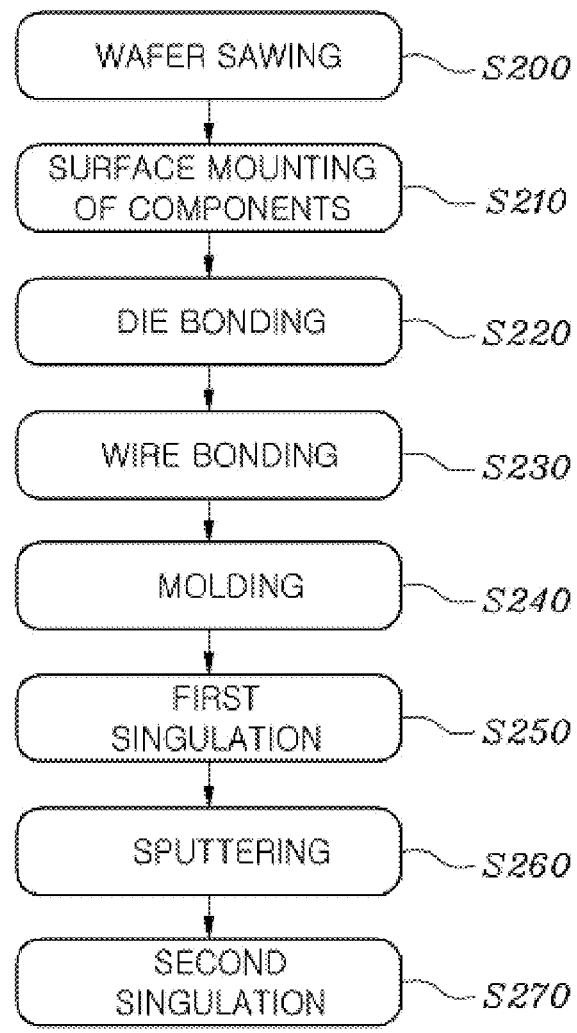

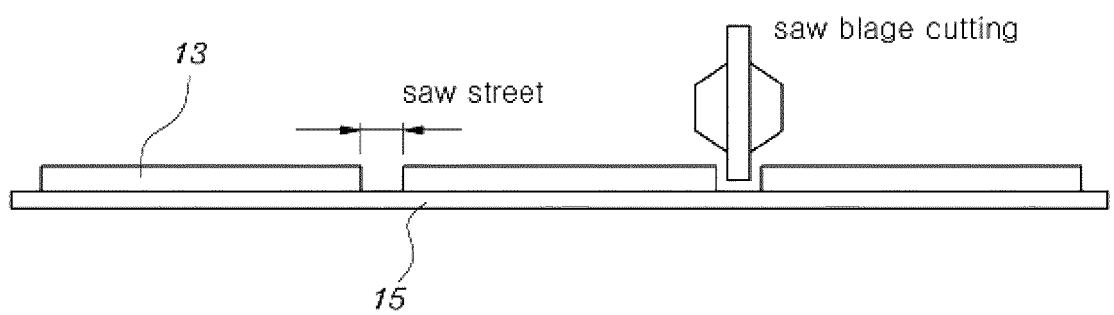
[FIG 3a]
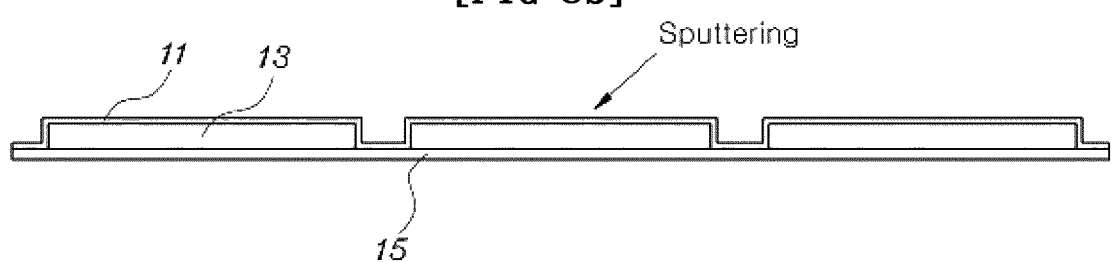
[FIG 3b]
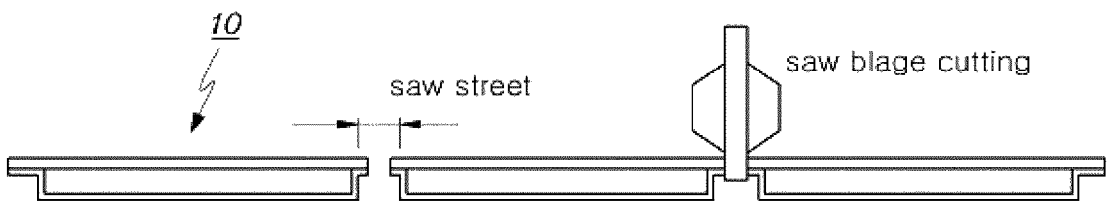
[FIG 3c]

[FIG 3d]
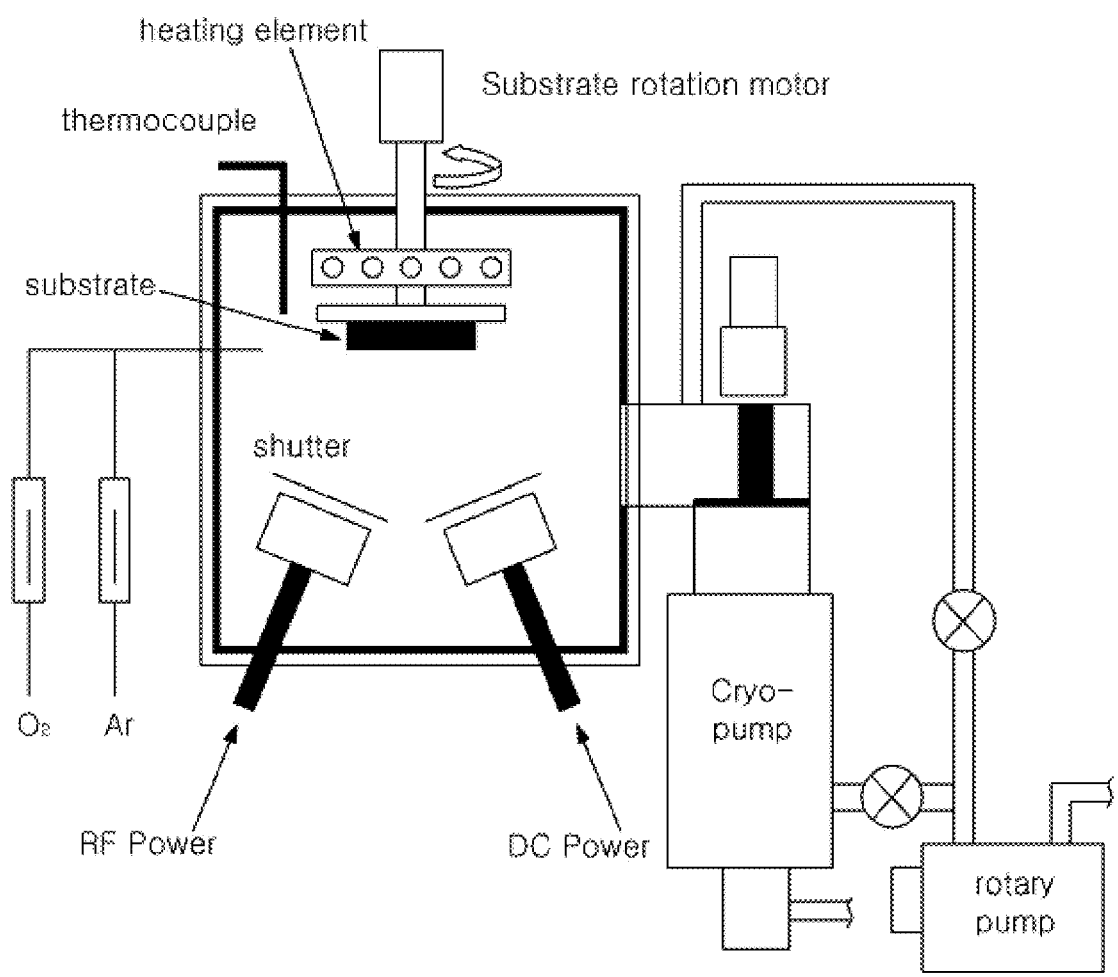

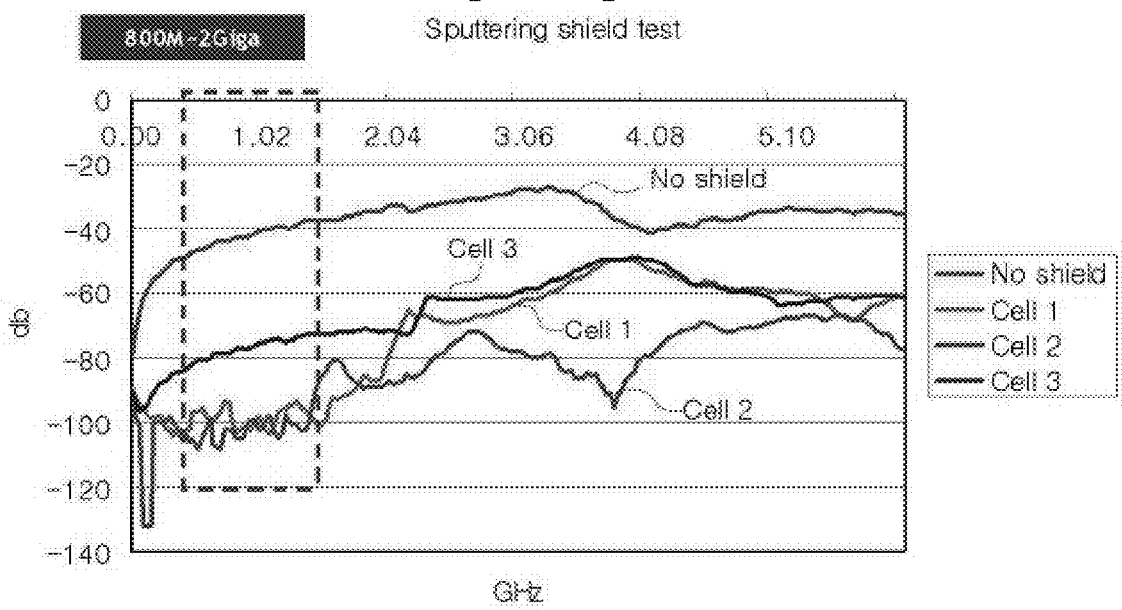
[FIG 4]
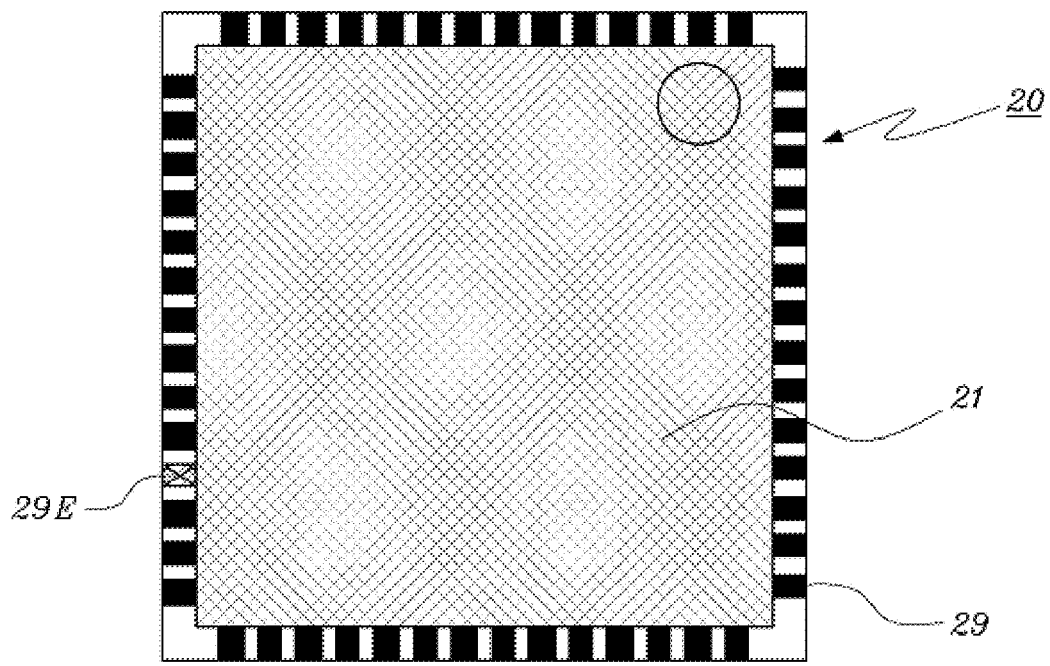
[FIG 5]

[FIG 6]
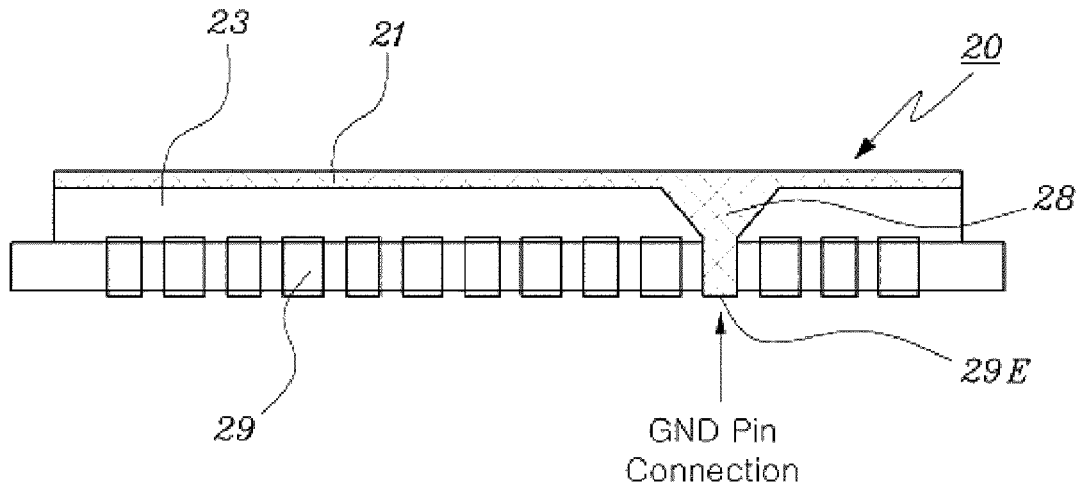
GND Pin Connection
[FIG 7]
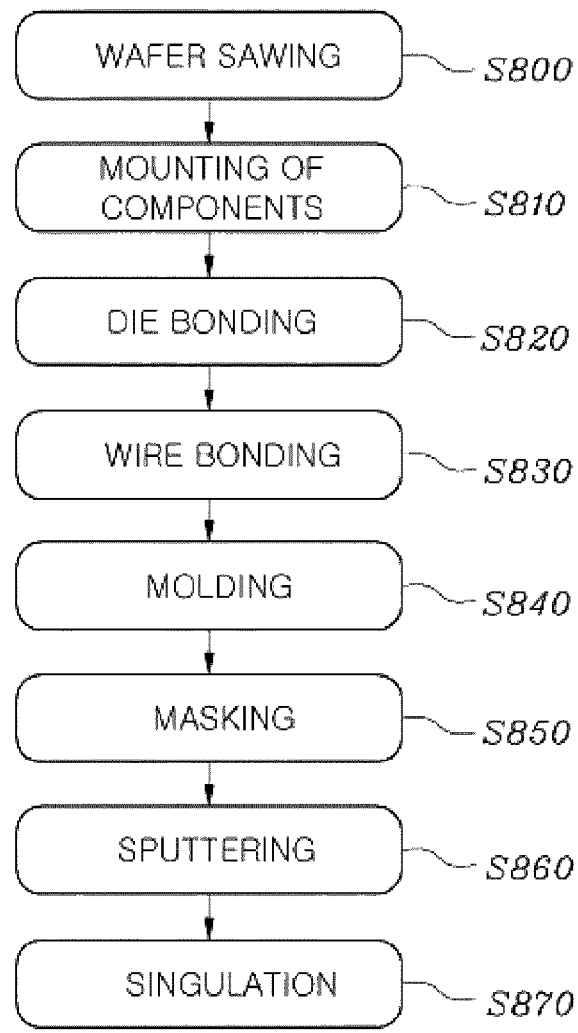

[FIG 8]
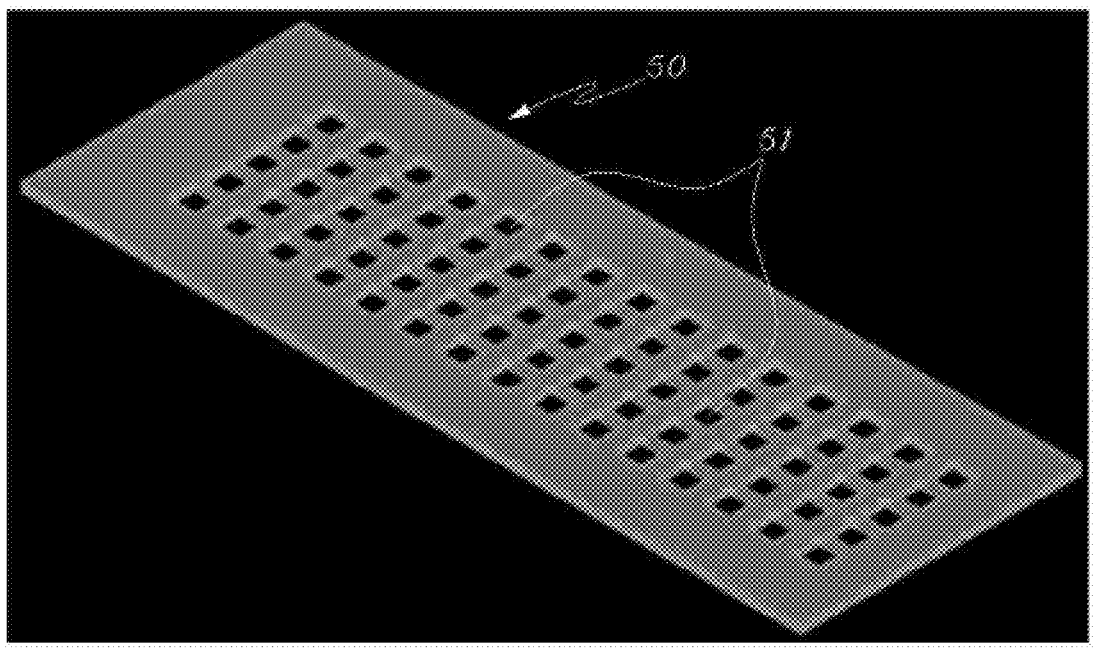
[FIG 9]
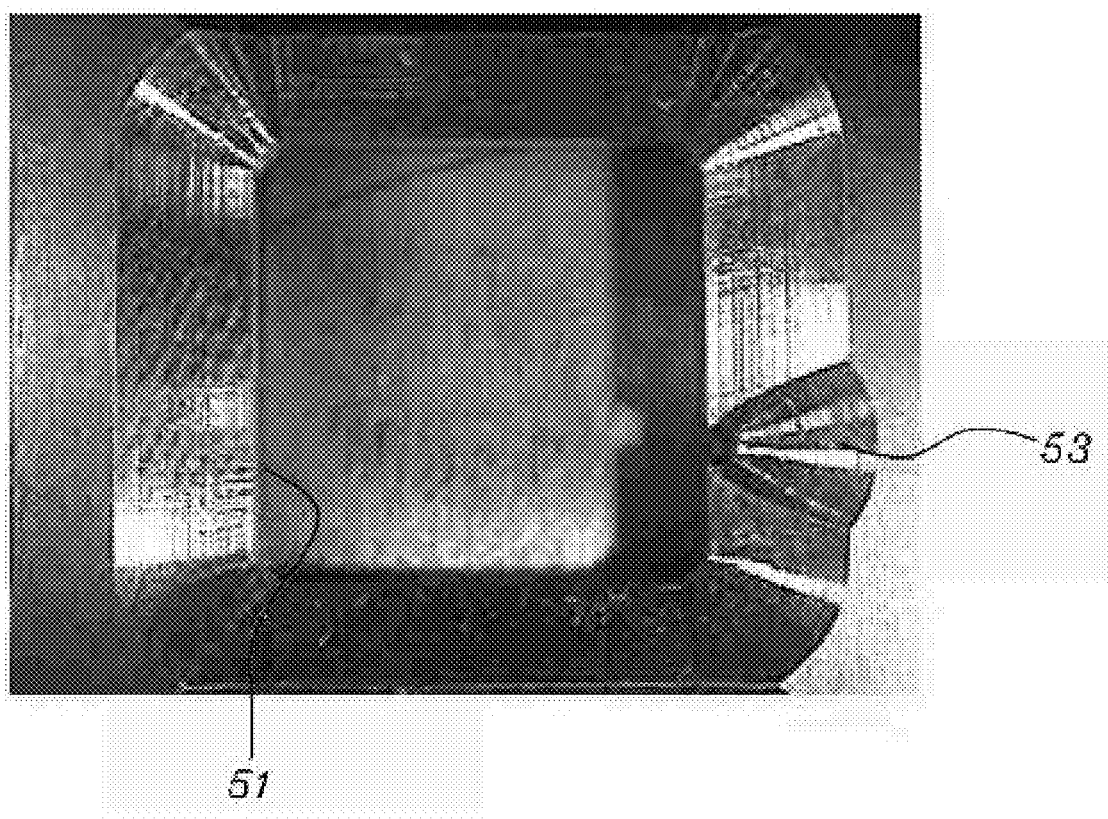

[FIG 10]
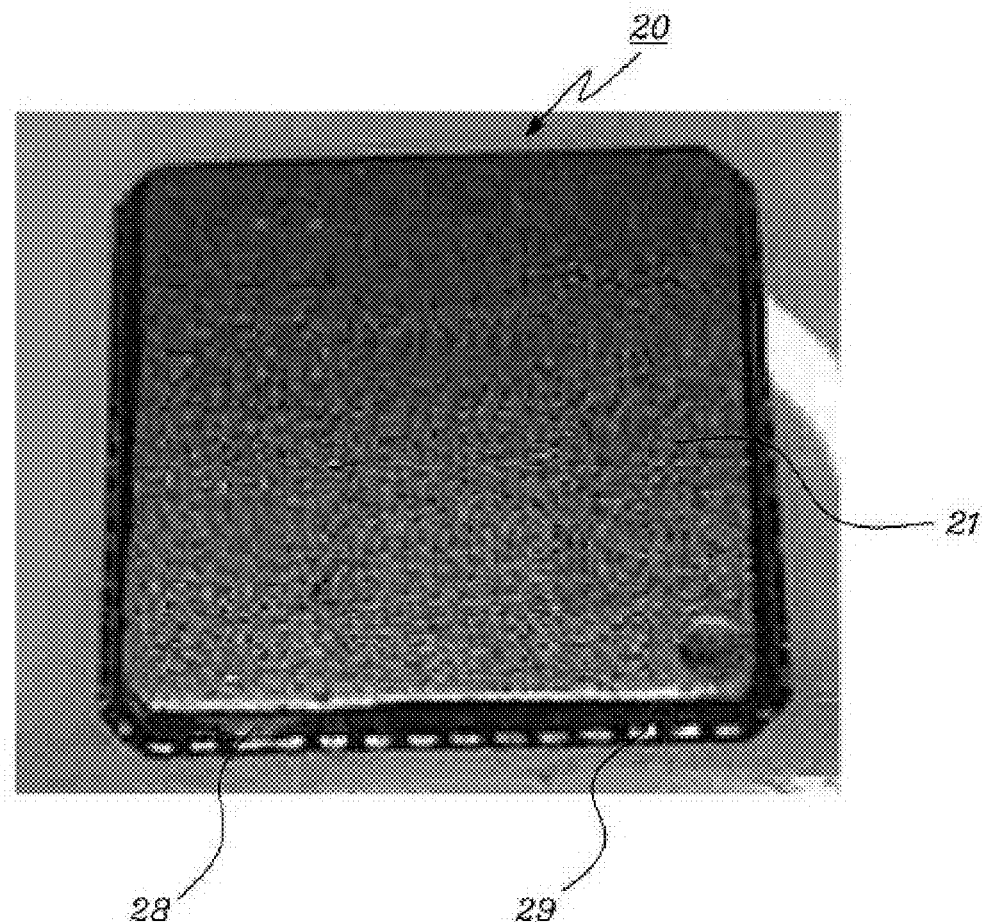
[FIG 11]
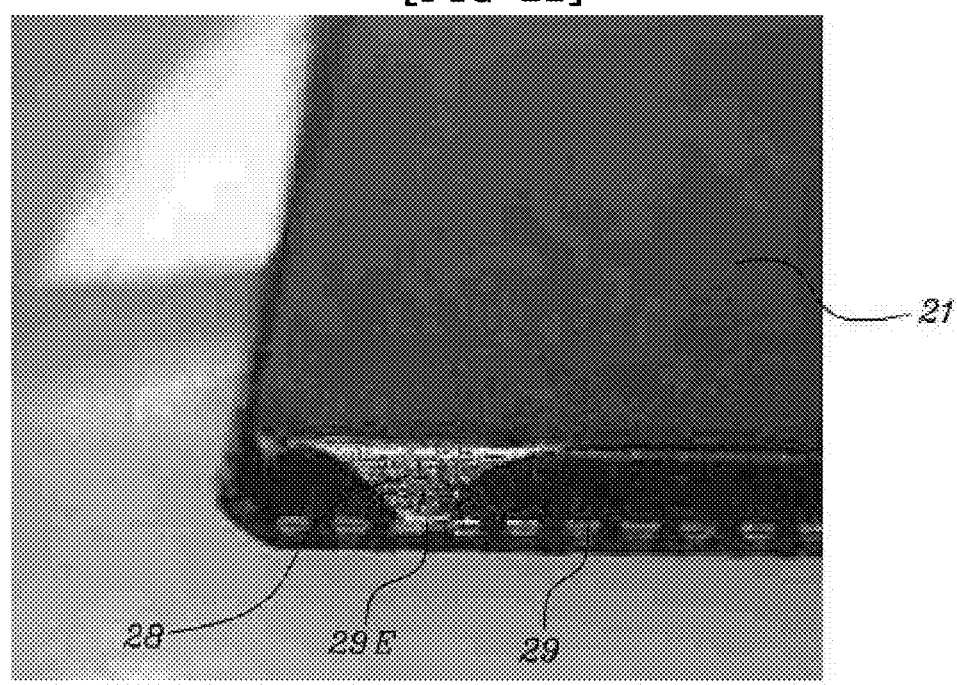

SEMICONDUCTOR PACKAGES HAVING ELECTROMAGNETIC INTERFERENCE-SHIELDING FUNCTION, MANUFACTURING METHOD THEREOF AND JIG

BACKGROUND OF THE INVENTION

1. Field of the Invention

The present invention relates to a semiconductor package having a function of shielding electromagnetic interference (EMI), a manufacturing method thereof and a jig, and more particularly, to such a semiconductor package having an electromagnetic interference (EMI)-shielding function, a manufacturing method thereof and a jig for use in a plasma sputtering, in which a nickel alloy is coated on the surface of a semiconductor package by a sputtering method so as to shield electromagnetic interference (EMI) generated from the semiconductor package.

2. Background of the Related Art

Recently, since the development of semiconductors, the semiconductors have been employed in a variety of electronic products such as household electric appliances, industrial equipment, medical equipment, etc. The semiconductor-related technology follows a trend toward miniaturization, lightness and multifunction, and digitalization of the equipment is also rapidly promoted.

In general, semiconductor devices emit electromagnetic radiation in the range of from 50 MHz to 3 GHz depending on the speed of the microprocessor. Recently, along with the development of a high-speed microprocessor, and the rapid increase in both the demand for high-speed networking and switching capacity, the emission amount of the electromagnetic radiation increases. That is, along with digitalization of the electronic product, the amount of electromagnetic radiation emitted therefrom is gradually increasing. Such electromagnetic radiation acts as electromagnetic interference (EMI) or radio frequency interference (RFI) that hinders the operation of other electronic equipment. For instance, EMI or RFI causes a problem in that advanced equipment such as an automatic facility system, an aircraft or the like is erroneously operated, stops in its operation, etc. Such erroneous operation or operation stoppage may cause enormous property damage and even casualties.

Accordingly, there have been proposed methods for shielding EMI or RFI from the semiconductor devices. For instance, U.S. Pat. No. 7,109,410 discloses a shielded electronic package in which a metallized cover serving as an EMI shield is separately fabricated to shield electromagnetic interference (EMI) and is mounted in the semiconductor devices. However, the above-mentioned package has the disadvantage that the manufacturing cost is raised due to an increase in the number of parts in the case where the metallized cover is fabricated separately, and the assembling work of parts is cumbersome due to additional provision of a process for mounting the metallized cover. In addition, the conventional package has a limitation that it works against the semiconductor development trend toward miniaturization.

In the meantime, there has been proposed a method in which the surface of the semiconductor device is plated by using electroless plating or spraying. In case of the electroless plating method, it is required that the semiconductor device should be soaked in an etching solution or a chemical precipitation tank. Thus, in the case where it is impossible to immerse the electronic package in the etching solution or the chemical precipitation tank, the plating itself becomes impossible. In addition, in case of the spraying method, spray efficiency is deteriorated, and a sprayed thickness is thick and non-uniform, which is not suitable for forming a thin film.

Therefore, there is a need for the development of a method for forming an electromagnetic interference (EMI) shielding film, which can coat an EMI shielding thin film on the surface of the semiconductor device in a simple and convenient manner and can be applied to all kinds of semiconductor devices

SUMMARY OF THE INVENTION

Therefore, the present invention has been made in view of the above problems, and it is an object of the present invention to provide a method for shielding electromagnetic interference (EMI) emitted from the semiconductor package, in which an overall process is very simple and convenient manner and the manufacturing cost is low and which can be applied to various kinds of semiconductor packages.

Another object of the present invention is to provide a semiconductor package having an electromagnetic interference (EMI)-shielding function, in which an electromagnetic interference (EMI)-shielding film is coated on the surface of a semiconductor package through a sputtering method by using a nickel alloy as a target metal.

Another object of the present invention is to provide a jig for use in a plasma sputtering device which is used to block a portion on which the electromagnetic interference (EMI)-shielding film does not need to be coated in forming the electromagnetic interference (EMI)-shielding film on the surface of the semiconductor package using the plasma sputtering device.

In order to accomplish the above object, in one aspect, the present invention provides a method for manufacturing a semiconductor package having an electromagnetic interference (EMI)-shielding function, including the steps of: a wafer sawing step of cutting a wafer with a diamond saw to separate the dice in the wafer into individual chips; a component surface-mounting step of attaching surface mounted components (SMC) on an electronic circuit; a die bonding step of bonding each of the chips on a substrate; a wire bonding step bonding a wire on both a bonding pad of the chip and the lead frame for the electrical interconnection between the chip and the substrate; a molding step of encapsulating the chip and the wire with a synthetic resin to form a mold; a masking step of blocking a region on the surface of the semiconductor package which needs not to be coated with the electromagnetic interference (EMI)-shielding film; a sputtering step of coating a target metal formed of nickel and silver, or nickel and copper on the surface of the mold using plasma sputtering device to form an electromagnetic interference (EMI)-shielding film; and a second singulation step of cutting the substrate so as to allow the respective molds to be separated from each other.

In another aspect, the present invention provides a method for manufacturing a semiconductor package having an electromagnetic interference (EMI)-shielding function, including the steps of: a wafer sawing step of cutting a wafer with a diamond saw to separate the dice in the wafer into individual chips; a component surface-mounting step of attaching surface mounted components (SMC) on an electronic circuit; a die bonding step of bonding each of the chips on a substrate; a wire bonding step bonding a wire on both a bonding pad of the chip and the lead frame for the electrical interconnection between the chip and the substrate; a molding step of encapsulating the chip and the wire with a synthetic resin to form a mold; a masking step of blocking a region on the surface of the semiconductor package which needs not to be coated with the electromagnetic interference (EMI)-shielding film; a sputtering step of coating a target metal formed of nickel and silver, or nickel and copper on the surface of the mold using plasma sputtering device to form an electromagnetic interference (EMI)-shielding film; and a second singulation step of cutting the substrate so as to allow the respective molds to be separated from each other.

In another aspect, the present invention provides a semiconductor package having an electromagnetic interference (EMI)-shielding function, which comprises a printed circuit board (PCB), a semiconductor chip mounted on the printed circuit board (PCB) and a mold which is adapted to encapsulate the semiconductor chip, wherein the surface of the mold is coated with an electromagnetic interference (EMI)-shielding film formed of a nickel-silver alloy or a nickel-copper alloy and having a thickness of 4000 to 8000 Å by a sputtering method.

In another aspect, the present invention provides a jig for sputtering-coating used to coat an electromagnetic interference (EMI)-shielding film on the surface of a semiconductor package using a plasma sputtering device, the jig having a flat plate-type structure which comprises: a plurality of jig holes each adapted to accommodate the semiconductor package therein in such a fashion that the top surface of the semiconductor package is exposed externally; and a fan-shaped coating groove depressedly formed at an side edge of each jig hole to correspond to a grounding terminal of the semiconductor package so that the electromagnetic interference (EMI)-shielding film extends from the top surface of the semiconductor package to the grounding terminal.

BRIEF DESCRIPTION OF THE DRAWINGS

The above features and advantages of the present invention will be more apparent from the following detailed description taken in conjunction with the accompanying drawings, in which:

FIG. 1 is a side cross-sectional view illustrating a semiconductor SIP module package having an electromagnetic interference (EMI)-shielding function according to the present invent ion;

FIG. 2 is a manufacturing process chart of the semiconductor SIP module package of FIG. 1;

FIG. 3a is a schematic cross-sectional view illustrating a module package in a first singulation step;

FIG. 3b is a schematic cross-sectional view illustrating a module package on which an electromagnetic interference (EMI)-shielding film is coated by a sputtering process;

FIG. 3c is a schematic cross-sectional view illustrating a module package in a second singulation step;

FIG. 3d is a block diagram illustrating the construction of a co-sputtering device.

FIG. 4 is a graph illustrating an EMI test result in which the sputter coating time is set to 20 mins, 25 mins and 30 mins, respectively;

FIG. 5 is a top plan view illustrating a punch QFN package having an electromagnetic interference (EMI)-shielding function according to the present invention;

FIG. 6 is a side view illustrating the punch QFN package of FIG. 5;

FIG. 7 is a manufacturing process chart of the punch QFN package of FIG. 5;

FIG. 8 is a photograph illustrating a jig;

FIG. 9 is an enlarged photograph illustrating a jig hole region; and

FIGS. 10 and 11 are photographs illustrating a punch QFN package in which only a grounding portion in a front and a side of a mold thereof is coated with an electromagnetic interference (EMI)-shielding film.

DETAILED DESCRIPTION OF THE PREFERRED EMBODIMENT

Reference will now be made in detail to the embodiments of the present invention, examples of which are illustrated in the accompanying drawings, wherein like reference numerals refer to the like elements throughout.

In the following description, the detailed description of known function and constructions unnecessarily obscuring the subject matter of the present invention will be avoided hereinafter. Terms to be described later are defined in consideration of functions in the present invention. Therefore, the terms may be changed depending on the intentions of users or administrators, customs or the like. Thus, the definitions should be made based on the entire description of the present invention.

FIG. 1 is a side cross-sectional view illustrating a semiconductor SIP module package having an electromagnetic interference (EMI)-shielding function according to the present invention, and FIG. 2 is a manufacturing process chart of the semiconductor SIP module package of FIG. 1.

The system-in-package (SIP) module package 10 of the present invention includes a printed circuit board (PCB) 15, a chip 14 and a mold 13. The surface of the mold 13 is coated with an electromagnetic interference (EMI)-shielding film 11 for shielding electromagnetic interference (EMI). The electromagnetic interference (EMI)-shielding film 11 is characterized in that it is formed of a nickel-silver alloy or a nickel-copper alloy, is coated on the surface of the mold 13 by a sputtering, and the coating thickness is 4000 to 8000 Å.

A process of manufacturing the SIP module package 10 according to this embodiment includes a wafer sawing step (S200), a component surface-mounting step (S210) by surface mount technology (SMT), a die bonding step (S220), a wire bonding step (S230), a molding step (S240), a first singulation step (S250), a sputtering step (S260), and a second singulation step (S270) as shown in FIG. 2.

First, the wafer sawing step (S200) is a step of cutting a wafer with a diamond saw to separate the dice in the wafer into individual chips. The component surface-mounting step (S210) is a step of attaching surface mounted components (SMC), which can be directly mounted on the surface of a substrate, i.e., the printed circuit board (PCB) 15, on an electronic circuit. The die bonding step (S220) is a step of bonding each chip 14 on the printed circuit board (PCB) 15. The wire bonding step (S230) is a step of bonding a gold or aluminum wire 16 on both a bonding pads of the chip 14 and the lead frame for the electrical interconnection between the chip and the substrate. The molding step (S240) is a step of encapsulating the chip 14 and the gold or aluminum wire 16 with a synthetic resin.

Next, the first singulation step (S260) is a step of half-cutting respective semiconductor module packages 10. This first singulation step (S260) is performed to externally expose a side of each semiconductor SIP module package 10 so as to allow the electromagnetic interference (EMI)-shielding film 11 to be coated on the side of the semiconductor SIP module package 10 since a plurality of semiconductor SIP module packages 10 is fabricated on one strip.

FIGS. 3a to 3c show a process of performing the first singulation step (S250), the sputtering step (S260), and the second singulation step (S270).

As shown in FIG. 3a, through the first singulation step (S260), the portions of the molds 13 of the SIP module package are half-cut. By doing so, a space between adjacent two respective molds 13 is depressed to allow a side of each mold 13 to externally exposed. Subsequently, as shown in FIG. 3b, the sputtering process (S270) is performed in which the electromagnetic interference (EMI)-shielding film 11 is coated on the mold 13. Thereafter, as shown in FIG. 3c, the substrate, i.e., the printed circuit board (PCB) 15 is full-cut to allow respective SIOP module packages 10 to be separated one by one through the second singulation step (S280).

Meanwhile, in the present invention, the sputtering step (S280) may be performed after the second singulation step (S280) has been performed. Further, after the second singulation step (S270) has been performed, a laser marking step (not shown) may be performed in which necessary characters and the like are imprinted on the top surface of the module package 10, for example, using a laser.

Now, the sputtering step (S260) which is a feature of the present invention will be described in more detail hereinafter.

The semiconductor module packages 10 which have been half-cut through the first singulation step (S250) and a target metal are placed in a sputtering chamber, and the underside of the PCB 15 which needs not to be coated with the EMI-shielding film are blocked. Thereafter, a plasma gas is filled in the sputtering chamber at a certain pressure, and then power is supplied to the sputtering chamber so as to allow the target metal to be deposited on the exposed surface of the semiconductor SIP module package 10.

The sputtering step (S260) may be performed by using a magnetron sputtering system, or the co-sputtering device as shown in FIG. 3d. At this time, a degree of vacuum of the sputtering chamber is 2.0 to $3.0 \times 10^{-3}$ Torr, preferably $2.5 \times 10^{-3}$ Torr. Argon (Ar, purity: 99.99%) gas of 100 to 150 sccm may be used as a reaction gas. At this time, the flow rate of the reaction gas is preferably 125 sccm.

A target metal may employ a nickel-silver alloy consisting of 10-90 wt % of nickel and 10-90 wt % of silver, or a nickel-copper alloy consisting of 10-90 wt % of nickel and 10-90 wt % of copper. If the content of nickel contained in the target metal is less than 10 wt % or more than 90 wt %, there is caused a problem in that an EMI-shielding effect is reduced.

Also, the sputtering step (S260) is preferably performed for 20-30 mins.

FIG. 4 is a graph illustrating an EMI test result obtained after the sputter coating operation has been performed for 20 mins, 25 mins and 30 mins, respectively, under the above condition by using a target metal material consisting of 10 wt % of nickel and 90 wt % of silver.

In the graph of FIG. 4, Cell #1 refers to the case where the sputtering step has been performed for 20 mins, Cell #2 refers to the case where the sputtering step has been performed for 25 mins, Cell #1 refers to the case where the sputtering step has been performed for 30 mins, and No-shield refers to the case where the electromagnetic interference (EMI)-shielding film 11 has not been formed. It was found that in the case where the sputtering step is performed for 20 to 30 mins, the thickness of the electromagnetic interference (EMI)-shielding film coated on the semiconductor package is 4000 to 8000 Å.

As shown in the graph of FIG. 4, it can be seen that the amount of EMI generated is reduced much more in the case where the electromagnetic interference (EMI)-shielding film 11 is coated on the semiconductor SIP module package 10 according to the present invention than in the case where the electromagnetic interference (EMI)-shielding film 11 is not coated on the semiconductor SIP module package 10. Particularly, it can be seen that in the frequency band of 800 MHz to 2 GHz used generally in the mobile communication, the amount of EMI generated is reduced more by 40 to 60 dB in the case of coating the electromagnetic interference (EMI)-shielding film 11 than in the case of not coating the electromagnetic interference (EMI)-shielding film 11.

Particularly, it was found that among Cell #1 to Cell #3, the EMI reduction effect is the greatest when the sputter coating time is set to 25 mins. In this case, the thickness of the electromagnetic interference (EMI)-shielding film 11 was measured to be 7000 to 8000 Å.

In the meantime, it was found that after the sputtering step, the electromagnetic interference (EMI)-shielding film 11 formed as a single layer is excellent in adhesion strength as a test result.

Meanwhile, as another embodiment of the present invention, FIG. 5 is a top plan view illustrating a punch QFN package having an electromagnetic interference (EMI)-shielding function according to the present invention, FIG. 6 is a side view illustrating the punch QFN package of FIG. 5, and FIG. 7 is a manufacturing process chart of the punch QFN package of FIG. 5; Similarly to the semiconductor SIP module package 10 of FIG. 1, the punch quad flat no-lead (QFN) package 20 according to this embodiment has an electromagnetic interference (EMI)-shielding film 21 formed on the surface of a mold 23 thereof so as to shield the electromagnetic interference (EMI).

A process of manufacturing the punch QFN package 20 includes a wafer sawing step (S800), a component surface-mounting step (S810), a die bonding step (S820), a wire bonding step (S830), a molding step (S840), a masking step (S850), a sputtering step (S860), and a singulation step (S870).

In the manufacturing process of the Punch QFN package 20, the half-cutting step in the manufacturing process of the semiconductor SIP module package 10, i.e., the first singulation step (S260) will be omitted. In addition, since the first four steps, i.e., the wafer sawing step (S800), the component surface-mounting step (S810), the die bonding step (S820), the wire bonding step (S830) and the molding step (S840), and the last two steps, i.e., the sputtering step (S860) and the singulation step (S870) are the same as those in the above-mentioned manufacturing process of the semiconductor SIP module package 10, the repeated description thereof will be omitted to avoid redundancy.

Similarly to the SIP module package 10, the Punch QFN package 20 is accommodated in the sputtering chamber and the electromagnetic interference (EMI)-shielding film 21 is coated on the externally exposed surface of the mold 23 through the above-mentioned sputtering method. In this case, the sputtering step (S860) may be performed before or after the singulation step (S870).

In this manner, when it is desired to coat the electromagnetic interference (EMI)-shielding film 21 on the mold 23, since leads 29 of the punch QFN package 20 are externally exposed, it is required that electromagnetic interference (EMI)-shielding film 21 should not be coated on the leads 29 but should be coated on a grounding terminal 29E. To this end, the other terminals, i.e., the leads 29 are coveringly blocked by using a jig 50 for masking as shown in FIG. 8 so as not to allow the electromagnetic interference (EMI)-shielding film 21 to be coated on the leads 29.

The jig 50 used in the masking step (S850), as shown in FIG. 8, has a flat plate-type structure in which a plurality of jig holes 51 each having a shape corresponding to the shape of the punch QFN package 20 is arranged equidistantly. Thus, each punch QFN package 20 is inserted into each jig hole 51 one by one so that the top surface of the mold 23 is externally exposed from the jig hole 51, and a side of the punch QFN package 20 is brought into close contact with an edge of the jig hole 51.

In this case, as shown in FIG. 9, the edge of each jig hole 51 has a fan-shaped coating groove 53 depressedly formed at a region corresponding to the grounding portion 28 of each punch QFN package 20. Thus, the electromagnetic interference (EMI)-shielding film 21 is also coated on the grounding portion 28 and the grounding terminal 29E formed at the side of the punch QFN package 20 through the coating groove 53.

In addition, the cross-section of the jig hole 51 is is preferably formed in a shape in which its width becomes gradually increased as it goes toward the top so as to allow the punch QFN package 20 to be easily inserted into and removed from the jig hole.

In the present invention, since the shape of the grounding portion 28 can be different depending on the kind of the punch QFN package 20, the shape of the coating groove 53 may be also formed differently depending on the position of the grounding portion 28.

FIG. 10 is a real photograph of a punch QFN package fabricated according to the present invention, and FIG. 11 is a magnified photograph of the grounding portion 28 of FIG. 10. As can be seen in FIGS. 10 and 11, the punch QFN package fabricated according to the present invention FIGS. 10 and 11 are photographs illustrating a punch QFN package in which only a grounding portion 28 extending to the grounding terminal 29E in a top and a side of a mold 23 thereof is coated with an electromagnetic interference (EMI)-shielding film 21.

In this manner, according to the present invention, the electromagnetic interference (EMI)-shielding film 11 or 21 formed of a nickel-silver alloy or a nickel-copper alloy can be coated on the surface of the mold 13, 23 of the semiconductor package such as the SIP module package 10, the punch QFN package 20 or the like through the sputtering method to thereby shield electromagnetic interference (EMI) emitted from or incident to the semiconductor package. Thus, since the electromagnetic radiation emitted from the semiconductor package can be shielded, it can be prevented that the electromagnetic radiation has an effect on the operation of other equipment or devices, thereby causing an error.

Like this, according to the present invention, even in case of the punch QFN package 20 which makes it difficult to coat the electromagnetic interference (EMI)-shielding film 11 when an conventional plating method is used for the reason of the structural characteristics, the use of the sputtering method enables the coating of the electromagnetic interference (EMI)-shielding film 11, and hence the electromagnetic interference (EMI)-shielding film can be formed on a variety of semiconductor packages.

In the meantime, although the SIP module package 10 and the punch QFN package 20 have been described in the above-mentioned embodiments, it is of course noted that the method of coating the electromagnetic interference (EMI)-shielding film 11 using the above-mentioned sputtering method can be applied to different kinds of packages.

According to the semiconductor package having an electromagnetic interference (EMI)-shielding function and a manufacturing method thereof, the electromagnetic interference (EMI)-shielding film formed of a nickel-silver alloy or a nickel-copper alloy can be coated on the surface of the mold of the semiconductor package through the sputtering method to thereby shield all the electromagnetic interferences (EMI) emitted from or incident to the semiconductor package.

Thus, it can be prevented that the electromagnetic radiation emitted from the semiconductor package has an effect on the operation of other equipment or devices, thereby causing an error. Further, since the coating of the electromagnetic interference (EMI)-shielding film is possible even in case of the semiconductor package such as the SIP module package or the punch QFN package, the electromagnetic interference (EMI)-shielding film can be formed on a variety of semiconductor packages.

While the present invention has been described with reference to the particular preferred embodiments, it will be understood by those skilled in the art that various modifications and variations can be made to the present invention without departing from the spirit and scope of the appended claims. Therefore, the disclosed embodiments should be considered in view of explanation, but no limitation. The technical scope of the present invention is taught in the claims, but not the detailed description, and all the differences in the equivalent scope thereof should be construed as falling within the present invention.

What is claimed is:

1. A method for manufacturing a semiconductor package having an electromagnetic interference (EMI)-shielding function, comprising the steps of:
   a wafer sawing step of cutting a wafer with a diamond saw to separate the dice in the wafer into individual chips;
   a component surface-mounting step of attaching surface mounted components (SMC) on an electronic circuit;
   a die bonding step of bonding each of the chips on a substrate;
   a wire bonding step bonding a wire on both a bonding pad of the chip and a lead frame for the electrical interconnection between the chip and the substrate;
   a molding step of encapsulating the chip and the wire with a synthetic resin to form a mold;
   a first singulation step of half-cutting respective molds so as to allow a space between adjacent two molds to be depressed by a predetermined width;
   a sputtering step of coating a target metal formed of nickel and silver, or nickel and copper on the surface of the mold using plasma sputtering device to form an electromagnetic interference (EMI)-shielding film; and
   a second singulation step of full-cutting the substrate so as to allow the respective molds to be separated from each other.

2. The method according to claim 1, wherein the sputtering step uses a nickel-silver alloy consisting of 10-90 wt % of nickel and 10-90 wt % of silver, or a nickel-copper alloy consisting of 10-90 wt % of nickel and 10-90 wt % of copper as the target metal, and the sputtering step is performed for 20 to 30 mins in a sputtering chamber having a degree of vacuum of 2.0 to 3.0×10-3 Torr, into which a reaction gas of 100 to 150 sccm is injected.

3. The jig according to claim 1, wherein the cross-section of the jig hole is formed in a shape in which its width becomes gradually increased as it goes toward the top.

4. A method for manufacturing a semiconductor package having an electromagnetic interference (EMI)-shielding function, comprising the steps of:
   a wafer sawing step of cutting a wafer with a diamond saw to separate the dice in the wafer into individual chips;
   a component surface-mounting step of attaching surface mounted components (SMC) on an electronic circuit;
   a die bonding step of bonding each of the chips on a substrate;
   a wire bonding step bonding a wire on both a bonding pad of the chip and a lead frame for the electrical interconnection between the chip and the substrate;

a molding step of encapsulating the chip and the wire with a synthetic resin to form a mold;

a masking step of blocking a region on the surface of the semiconductor package which needs not to be coated with the electromagnetic interference (EMI)-shielding film;

a sputtering step of coating a target metal formed of nickel and silver, or nickel and copper on the surface of the mold using plasma sputtering device to form an electromagnetic interference (EMI)-shielding film; and a second singulation step of cutting the substrate so as to allow the respective molds to be separated from each other.

5. The method according to claim 4, wherein the sputtering step uses a nickel-silver alloy consisting of 10-90 wt % of nickel and 10-90 wt % of silver, or a nickel-copper alloy consisting of 10-90 wt % of nickel and 10-90 wt % of copper as the target metal, and the sputtering step is performed for 20 to 30 mins in a sputtering chamber having a degree of vacuum of 2.0 to 3.0×10-3 Torr, into which a reaction gas of 100 to 150 sccm is injected.

6. The method according to claim 4, wherein the masking step uses a jig for plasma-sputtering having a jig holes for receiving the semiconductor package so as to block a region on the surface of the semiconductor package which needs not to be coated with the electromagnetic interference (EMI)-shielding film.

7. The jig according to claim 4, wherein the cross-section of the jig hole is formed in a shape in which its width becomes gradually increased as it goes toward the top.

8. A semiconductor package having an electromagnetic interference (EMI)-shielding function, which comprises a printed circuit board (PCB), a semiconductor chip mounted on the printed circuit board (PCB) and a mold which is adapted to encapsulate the semiconductor chip, wherein the surface of the mold is coated with an electromagnetic interference (EMI)-shielding film formed of a nickel-silver alloy or a nickel-copper alloy and having a thickness of 4000 to 8000 Å by a sputtering method.

9. A jig for sputtering-coating used to coat an electromagnetic interference (EMI)-shielding film on the surface of a semiconductor package using a plasma sputtering device, the jig having a flat plate-type structure which comprises: a plurality of jig holes each adapted to accommodate the semiconductor package therein in such a fashion that the top surface of the semiconductor package is exposed externally; and a fan-shaped coating groove depressedly formed at an side edge of each jig hole to correspond to a grounding terminal of the semiconductor package so that the electromagnetic interference (EMI)-shielding film extends from the top surface of the semiconductor package to the grounding terminal.

\* \* \* \* \*